US000001373H

United States Statutory Invention Registration [19]

[11] Reg. Number: H1373

Durham et al.

[43] Published: Nov. 1, 1994

[54] WAFER HANDLING APPARATUS AND METHOD

[75] Inventors: Christopher E. Durham, Lower Pottsgrove Township, Montgomery County; William J. Malriat, Alsace Township, Berks County; Allen R. Melcher, Washington Township, Berks County; Randy J. Penn, Salisbury Township, Lehigh County, all of Pa.

[73] Assignee: American Telephone and Telegraph Company, New York, N.Y.

[21] Appl. No.: 862,920

[22] Filed: Apr. 6, 1992

[51] Int. Cl.[5] ..... B65G 65/02; B66C 1/02

[52] U.S. Cl. ..... 414/786; 294/64.1; 414/627

[58] Field of Search ..... 414/627, 737, 752, 786, 414/937, 938, 941; 901/40; 294/64.1, 65; 269/21

[56] References Cited

U.S. PATENT DOCUMENTS

| | | | |
|---|---|---|---|
| 2,798,757 | 7/1957 | Jackson | 294/64.1 |
| 4,050,729 | 9/1977 | Hutson | 294/64.1 |
| 4,282,924 | 8/1981 | Faretra | 165/80 |
| 4,389,064 | 6/1983 | Laverriere | 414/627 X |
| 4,564,188 | 1/1986 | McNair | 414/330 X |
| 4,687,542 | 8/1987 | Davis et al. | 156/643 |
| 4,773,687 | 9/1988 | Bush et al. | 294/64.1 |
| 4,983,093 | 1/1991 | Foulke et al. | 414/416 |
| 4,987,856 | 1/1991 | Hey et al. | 118/723 |
| 5,013,075 | 5/1991 | Littell | 294/64.1 |
| 5,079,903 | 1/1992 | Hakansson | 414/416 X |
| 5,118,153 | 6/1992 | Allison et al. | 294/64.1 |

FOREIGN PATENT DOCUMENTS

| | | | |
|---|---|---|---|
| 1506502 | 6/1969 | Germany | 294/64.1 |
| 61-140432 | 6/1986 | Japan | 414/941 X |
| 2156582 | 10/1985 | United Kingdom | 414/937 X |

*Primary Examiner*—David H. Brown
*Attorney, Agent, or Firm*—Wendy W. Koba

[57] ABSTRACT

Apparatus and method are disclosed for providing the transfer of a semiconductor wafer from a first to a second location. The apparatus includes a transfer arm including a plurality of apertures to facilitate the attachment of a bowed wafer, without breakage or frontside contact, to the transfer arm. The size, number and location of the apertures may be determined in accordance with the size of the wafer, the amount of bow, as well as the type of bow (i.e., simple or complex). A plurality of flexible members may be disposed in a one-to-one relationship with the apertures and utilized to achieve a secure vacuum seal of the wafer to the transfer arm.

8 Claims, 3 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

WAFER HANDLING APPARATUS AND METHOD

BACKGROUND OF THE INVENTION

1. Technical Field

The present invention relates to wafer handling apparatus and method and, more particularly, to such apparatus and method for handling semiconductor wafers exhibiting significant bow.

2. Description of the Prior Art

During the processing of semiconductor wafers, some wafers may begin to exhibit warpage in the form of wafer bow, either simple (uniformly convex), compound (skewed convex), or complex (a composite of concave and convex). In particular, dielectrically isolated (DI) wafers may exhibit bow as a result of various processes utilized in forming the relatively thick polysilicon support layer (often referred to as a "handle"). In subsequent processing operations, the wafers must often be transferred individually between a carrier and a vacuum chuck. A transfer member, often referred to as a "transfer arm" or "transfer finger", may be utilized to perform this task. In general, a transfer arm is attached to a selected wafer by a vacuum through a relatively large opening in the surface of the arm. An O-ring may surround the opening to cushion the attachment and attempt to provide a vacuum seal. When utilized with wafers exhibiting significant bow (e.g., bow exceeding approximately 8 mils), an operator may be required to assist in the attachment, by forcing the wafer to lie flat against the transfer arm. This process obviously has the potential to damage the wafer surface or, in the extreme, result in breaking the wafer.

Therefore, a need remains for an improved method and apparatus for facilitating the transfer of bowed wafers.

SUMMARY OF THE INVENTION

The need remaining in the prior art is addressed by the present invention which relates to apparatus and method for handling wafers and, more particularly improved transfer arm apparatus and method for handling bowed wafers.

In accordance with an exemplary embodiment of the present invention, a transfer member comprises a vacuum-assisted transfer arm for contacting a selected wafer. The surface of the arm is formed to include a plurality of apertures which are connected to the vacuum source. Thus, upon activation of the vacuum, the wafer is drawn against the plurality of apertures so as to contact the transfer member. The utilization of a plurality of such apertures allows for wafers with significant bow (e.g., exceeding eight mils) to contact the transfer member without operator assistance.

For a particular embodiment of the present invention, each aperture may be fitted with a flexible surround piece which extends outward to contact the non-flat wafer surface. The surround piece, in particular, may comprise a flexible suction cup design such that once a vacuum is attained, the flexible surround piece is depressed so as to allow the wafer to be pulled against the flat reference of the transfer arm.

It is an advantage of the present invention that a transfer arm may be designed to include any suitable number of such vacuum-assisted apertures, as a function of the overall wafer dimension and/or expected wafer bow, for example.

Other and further advantages of the present invention will become apparent during the course of the following discussion and by reference to the accompanying drawings.

BRIEF DESCRIPTION OF THE DRAWING

Referring now to the drawings, where like numerals represent like parts in several views.

DETAILED DESCRIPTION

Figure 1:
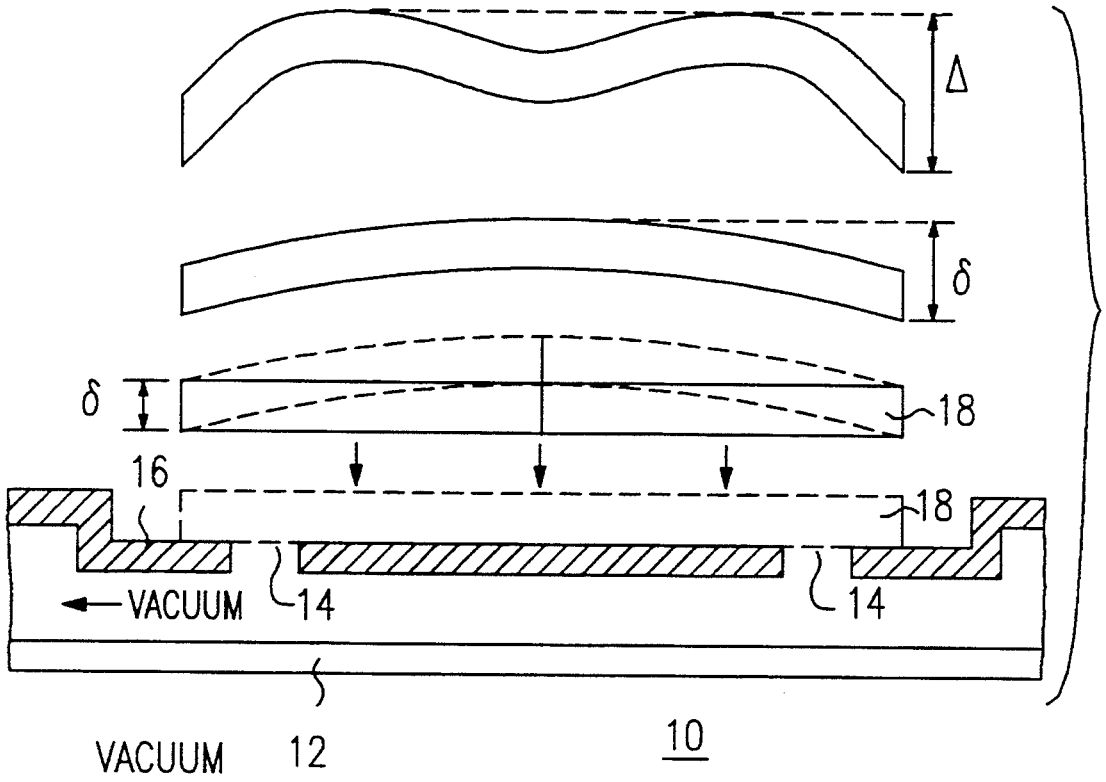
FIG. 1 is a cut-away view in perspective of an exemplary transfer arm formed in accordance with the present invention.

FIG. 1 contains a cut-away view in perspective, but not to scale, of an exemplary wafer transfer member 10 formed in accordance with the teachings of the present invention. End region 12 of member 10, also referred to as transfer arm, is illustrated as including a plurality of apertures 14. As shown, apertures 14 are formed in top surface 16 of transfer arm 12 and coupled to a vacuum source (not shown). In operation of transfer arm 12, arm 12 is moved in proximity to a selected wafer 18. The vacuum source is activated and wafer 18 is drawn toward top surface 16, as indicated by the arrows and shown in phantom in FIG. 1.

Figure 2:
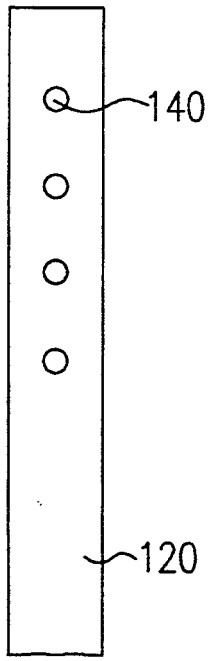
FIG. 2 is a simplified top view of the transfer arm of FIG. 1.

In contrast to prior art arrangements (which utilized only a single, relatively large vacuum-assisted aperture to affect the attachment and often resulted in damage or breakage to wafers with significant bow), the utilization of a plurality of apertures 14 in accordance with the teachings of the present invention allows for semiconductor wafers with relatively large bow (e.g., in the range of approximately 4 to 30 mils) to be attached to top surface 16 of transfer arm 12 without operator assistance. The spacing, number, and size of the apertures may be determined by the user so as to most effectively provide the attachment. For example, when being used with wafers exhibiting only simple bow of relatively small dimension $\gamma$, as shown in FIG. 1, a transfer arm of the present invention may require only a pair of apertures. In contrast, when used with wafers exhibiting complex bow of relatively large dimension $\Delta$, as shown in FIG. 1, a transfer arm of the present invention may require a larger a number of apertures, disposed in a pattern which is capable of providing wafer attachment. FIG. 2 contains a top view of an exemplary transfer arm 120 including four apertures 140 as may be required for utilization with wafers exhibiting complex bow.

Figure 3:
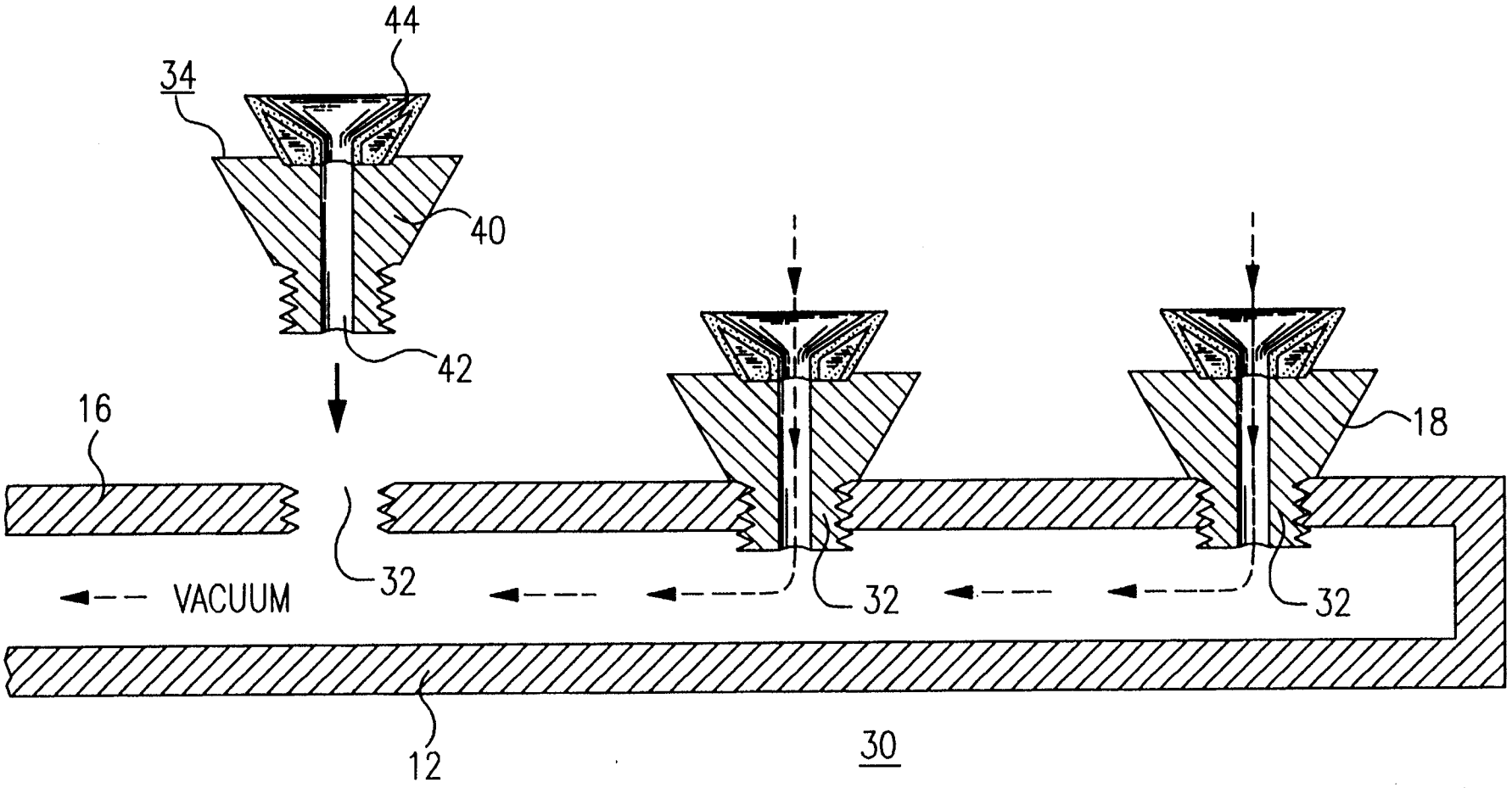
FIG. 3 contains a cut-away view in perspective of an alternative embodiment of the present invention.

An alternative embodiment of the present invention is illustrated in FIG. 3, which shows a partial cut-away side view of an exemplary transfer arm 30 including a plurality of vacuum-assisted apertures 32. Additionally, arm 30 comprises a plurality of threaded screw members 34, with a separate screw member disposed at each aperture. For the particular embodiment illustrated in FIG. 3, apertures 32 are formed as threaded apertures and screw members 34 include a flat-head screw surface 40 which functions as a flat reference surface for the wafer during attachment. Screw 34 further comprises a central bore 42 to form a path for the vacuum. Further, screw members 34 include a flexible member 44 disposed to surround the perimeter of bore 42 to provide a suction vacuum seal of a selected wafer (now shown) upon attachment. It is obvious that other suitable arrangements may be utilized, for example, where the flexible member is directly attached to the surface of arm 30 in the vicinity of each aperture 32.

Figure 4:
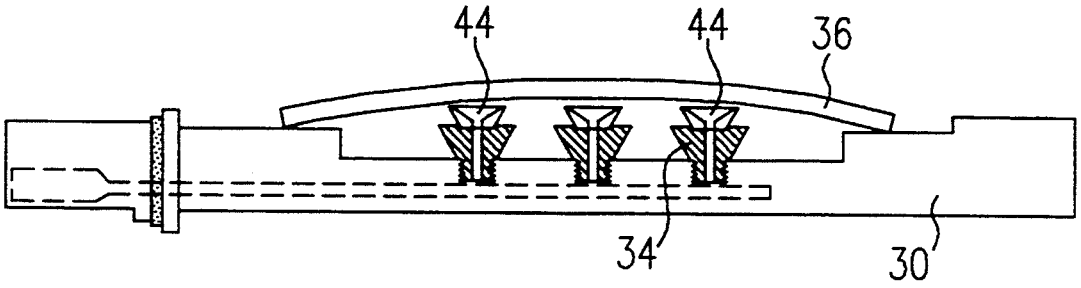
FIGS. 4–6 illustrate the operation of an exemplary transfer arm of the present invention for providing attachment of a bowed semiconductor wafer.
Figure 5:
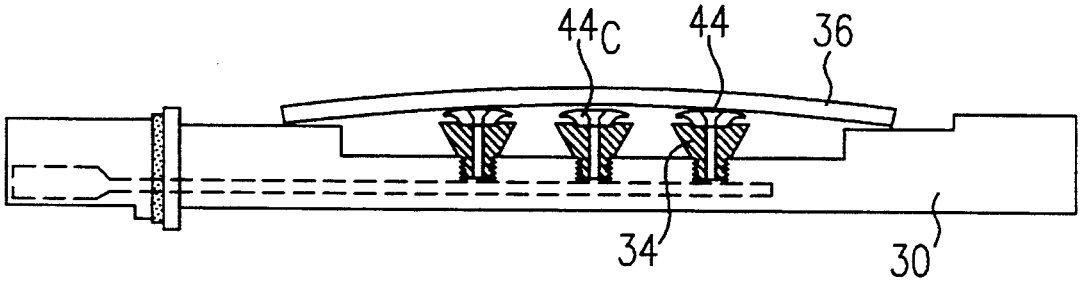
Figure 6:
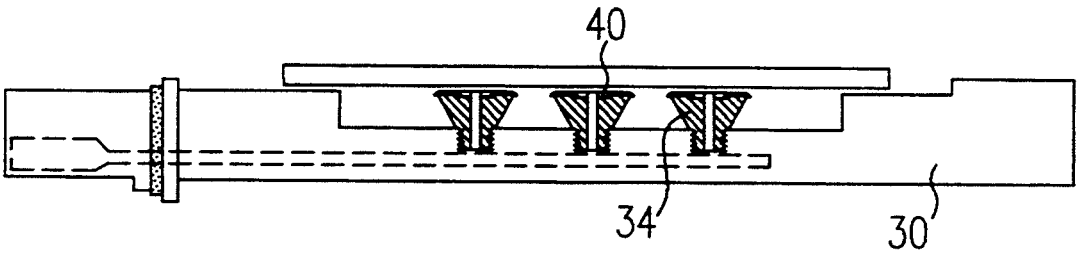

FIGS. 4–6 illustrate in detail the action of an exemplary transfer arm during the process of attaching a bowed wafer to transfer member. Referring to FIG. 4, a wafer 36 exhibiting bow is first placed over a transfer arm, such as transfer arm 30 discused above in association with FIG. 3. Before the activation of the vacuum source, wafer 36 may rest upon the plurality of flexible members 44, as shown in FIG. 4. As the vacuum source is turned on, flexible members 44 (in particular, the outer members), begin to deform and allow a suction to form between central flexible member $44_c$ and wafer 36, as shown in FIG. 5. When all apertures have achieved a vacuum seal, flexible members 44 are all deformed as shown in FIG. 6 and wafer 36 is positioned along the flat reference formed by surface 40 of member 34.

We claim:

1. Apparatus for providing transfer of a semiconductor wafer from a first location, said apparatus including a transfer arm for attaching to said wafer, characterized in that the transfer arm comprises a top and a bottom major surface, with a vacuum port formed therebetween, said transfer arm including a plurality of vacuum-assisted apertures for facilitating the attachment of a selected wafer to said transfer arm top major surface.

2. Apparatus as defined in claim 1 wherein the transfer arm further comprises flexible means disposed within each aperture to provide a vacuum seal with the selected wafer upon attachment.

3. Apparatus as defined in claim 2 wherein the plurality of vacuum-assisted apertures includes threaded openings and the apparatus further comprises a plurality of flexible members capable of being mated with said plurality of threaded apertures.

4. Apparatus for providing transfer of a semiconductor wafer exhibiting bow, said apparatus including a transfer arm for attaching to said bowed wafer characterized in that the transfer arm comprises a top and a bottom major surface, with a vacuum port formed therebetween, said transfer arm including a plurality of vacuum-assisted apertures for facilitating the attachment of a selected bowed wafer to said transfer arm top major surface.

5. Apparatus as defined in claim 4 wherein said plurality of vacuum-assisted apertures comprises a number of separate apertures sufficient to provide attachment of a wafer with bow in the range of four to thirty mils.

6. Apparatus as defined in claim 4 wherein the transfer arm further comprises flexible means disposed within each aperture to provide vacuum sealing of the selected bowed wafer upon attachment with said transfer arm.

7. A method of transferring a semiconductor wafer from a first location to a second location, the method comprising the steps of:

a) moving a transfer arm into the vicinity of a selected wafer, the transfer arm comprising a top and a bottom major surface with a vacuum port formed therebetween, said transfer arm including a plurality of vacuum-assisted apertures;

b) activating a vacuum source coupled to said transfer arm vacuum port;

c) attaching the selected wafer against the plurality of apertures;

d) moving the transfer arm and attached wafer to the second location; and e) deactivating the vacuum source so as to release the selected wafer.

8. The method according to claim 7 wherein in performing step c), performing the further step of sealing the attaching of the wafer to the transfer arm, utilizing a plurality of flexible members associated in a one-to-one relationship with the plurality of apertures.

* * * * *